(12) United States Patent
Chiang et al.

(10) Patent No.: US 8,248,355 B2
(45) Date of Patent: Aug. 21, 2012

(54) SHIFT REGISTER AND LIQUID CRYSTAL DISPLAY USING SAME

(75) Inventors: Chien-Hsueh Chiang, Miao-Li (TW); Sz-Hsiao Chen, Maio-Li (TW)

(73) Assignee: Chimei Innolux Corporation, Miaoli County (TW)

( * ) Notice: Subject to any disclaimer, the term of this patent is extended or adjusted under 35 U.S.C. 154(b) by 973 days.

(21) Appl. No.: 12/231,502

(22) Filed: Sep. 2, 2008

(65) Prior Publication Data

US 2009/0058790 A1 Mar. 5, 2009

(30) Foreign Application Priority Data

Aug. 31, 2007 (CN) .......................... 2007 1 0076761

(51) Int. Cl.
*G09G 3/36* (2006.01)
(52) U.S. Cl. .............. 345/100; 377/64; 377/73; 377/74; 377/79; 377/81
(58) Field of Classification Search ............ 345/87–103; 377/64, 73, 74, 79, 81; 327/241; 340/12.21, 340/825.68; 365/78, 189.12, 240; 708/252; 711/109
See application file for complete search history.

(56) References Cited

U.S. PATENT DOCUMENTS

| | | | | |
|---|---|---|---|---|
| 4,974,184 A | * | 11/1990 | Avra | .............................. 708/252 |
| 7,027,550 B2 | | 4/2006 | Lin | |
| 7,317,780 B2 | * | 1/2008 | Lin et al. | .......................... 377/67 |
| 7,319,452 B2 | * | 1/2008 | Moon | ............................ 345/100 |
| 7,450,681 B2 | * | 11/2008 | Wei et al. | ......................... 377/64 |
| 2004/0080970 A1 | * | 4/2004 | Kokubo et al. | ................. 365/63 |
| 2004/0207590 A1 | * | 10/2004 | Lu et al. | .......................... 345/93 |
| 2004/0234020 A1 | * | 11/2004 | Yu | .................................... 377/64 |
| 2008/0048964 A1 | * | 2/2008 | Chang et al. | .................... 345/98 |
| 2008/0143666 A1 | * | 6/2008 | Wei et al. | ...................... 345/100 |
| 2008/0187089 A1 | * | 8/2008 | Miyayama et al. | ............. 377/79 |
| 2008/0219401 A1 | * | 9/2008 | Tobita | ............................. 377/79 |

OTHER PUBLICATIONS

File d_flip_flop_wiki_7_19_2006.pdf is attached, which is based on internet wayback machine achive of "flip flop" wikipedia page as of Jul. 19, 2006, available at: http://web.archive.org/web/20060719065106/http://en.wikipedia.org/wiki/Flip-flop_%28electronics%29.*

* cited by examiner

*Primary Examiner* — Alexander S Beck
*Assistant Examiner* — Charles Zheng
(74) *Attorney, Agent, or Firm* — WPAT, P.C.; Justin King

(57) ABSTRACT

The present invention relates to a shift register and a liquid crystal display using the same. The liquid crystal display includes a liquid crystal panel, a data driving circuit and a scanning driving circuit. The data driving circuit and the scanning driving circuit each include a shift register. The shift register includes a plurality of shift register units. Two adjacent shift register units respectively receive two inverse clock signals and a VGL signal. Each shift register unit includes a signal output circuit, a signal input circuit, a first logic converting circuit, and a second logic converting circuit. The present shift register and a liquid crystal display have simple structure.

17 Claims, 4 Drawing Sheets

SHIFT REGISTER AND LIQUID CRYSTAL DISPLAY USING SAME

FIELD OF THE INVENTION

Embodiments of the present disclosure relate to a shift register, and more particularly to a shift register in a liquid crystal display (LCD).

GENERAL BACKGROUND

Shift registers are core circuit units of integrated circuits that are used in products such as thin film transistor liquid crystal displays (TFT-LCDs). A shift register provides sequential pulse signals to scanning lines of a TFT-LCD, so as to control on and off states of TFTs connected to the scanning lines.

Referring to FIG. 5, one such shift register unit 100 includes a first clock inversion circuit 110, an inverter 120, and a second clock inversion circuit 130. All transistors in the first clock inversion circuit 110, the inverter 120, and the second clock inversion circuit 130 are PMOS (P-channel metal oxide semiconductor) transistors. The first clock inversion circuit 110 receives an output signal VS from a pre-stage shift register unit (not shown). The output signal VS functions as a start signal.

The first clock inversion circuit 110 includes a first transistor P1, a second transistor P2, a third transistor P3, a fourth transistor P4, a first output V1, and a second output V2. The inverter 120 includes a fifth transistor P5 and a sixth transistor P6. The inverter 120 outputs an output signal that serves as a shift register signal V. The second clock inversion circuit 130 and the first clock inversion circuit 120 have similar structures. The second clock inversion circuit 130 includes a seventh transistor P7, an eighth transistor P8, a ninth transistor P9, and a tenth transistor P10.

Referring to FIG. 6, a sequence waveform diagram of pulse signals of the shift register unit 100 is shown. During a period t1, the inverter 120 and the second clock inversion circuit 130 perform a latch operation. During the latch operation, the sixth transistor P6 is switched off such that the shift register signal V of the inverter 120 keeps an original state of the previous stage. During a period t2, no latch operation is performed. The start signal VS is applied to the inverter 120, and the second clock inversion circuit 130 keeps the same state as the start signal VS. Furthermore, the first transistor P1 is switched on because the start signal VS jumps to a low voltage, such that the fifth transistor P5 is switched off and the sixth transistor P6 is switched on. Thus, the inverter 120 outputs the shift register signal V having a low level through the activated sixth transistor P6. During a period t3, the inverter 120 and the second clock inversion circuit 130 perform latch operation. The inverter 120 maintains output of a low level shift register signal V through the activated sixth transistor P6. During a period t4, no latch operation is performed. The inverter 120 stops output of the low-level shift register signal V.

The shift register unit 100 outputs a low level shift register signal during period t2, and at the same time, the next-stage shift register unit (not shown) also outputs a low level shift register signal. However, the shift register unit 100 installs so many transistors and other elements therein, which makes the layout thereof unduly complicated.

What is needed, therefore, is a shift register which can overcome the above-described deficiencies. What is also needed is an LCD device including the shift register.

SUMMARY

A shift register includes a plurality of shift register units being controlled by a low level voltage signal, two reversed clock signals. Each of the shift register unit includes an output circuit, an input circuit, a first logic circuit, and a second logic circuit. The input circuit controls the first logic circuit to output the low level voltage signal or the clock signals, and controls the output circuit to output clock signals. Further, the second logic circuit controls the output circuit to output the low level voltage signal.

A liquid crystal display includes a liquid crystal panel, a gate driving circuit, and a data driving circuit. Each of the gate driving circuit and the data driving circuit includes at least one shift register, and each of the shift registers includes a plurality of shift register units connected in stages. Further, each of the shift register unit is controlled by a low level voltage signal, two inverse clock signals. Each shift register unit includes an input circuit, an output circuit, first logic circuit, and a second logic circuit. The input circuit controls the first logic circuit to output the low level voltage signal or the clock signals, and controls the output circuit to output clock signals; the second logic circuit control the output circuit to output the low level voltage signal.

Other novel features and advantages will become more apparent from the following detailed description when taken in conjunction with the accompanying drawings.

DETAILED DESCRIPTION OF CERTAIN INVENTIVE EMBODIMENTS

Figure 1:
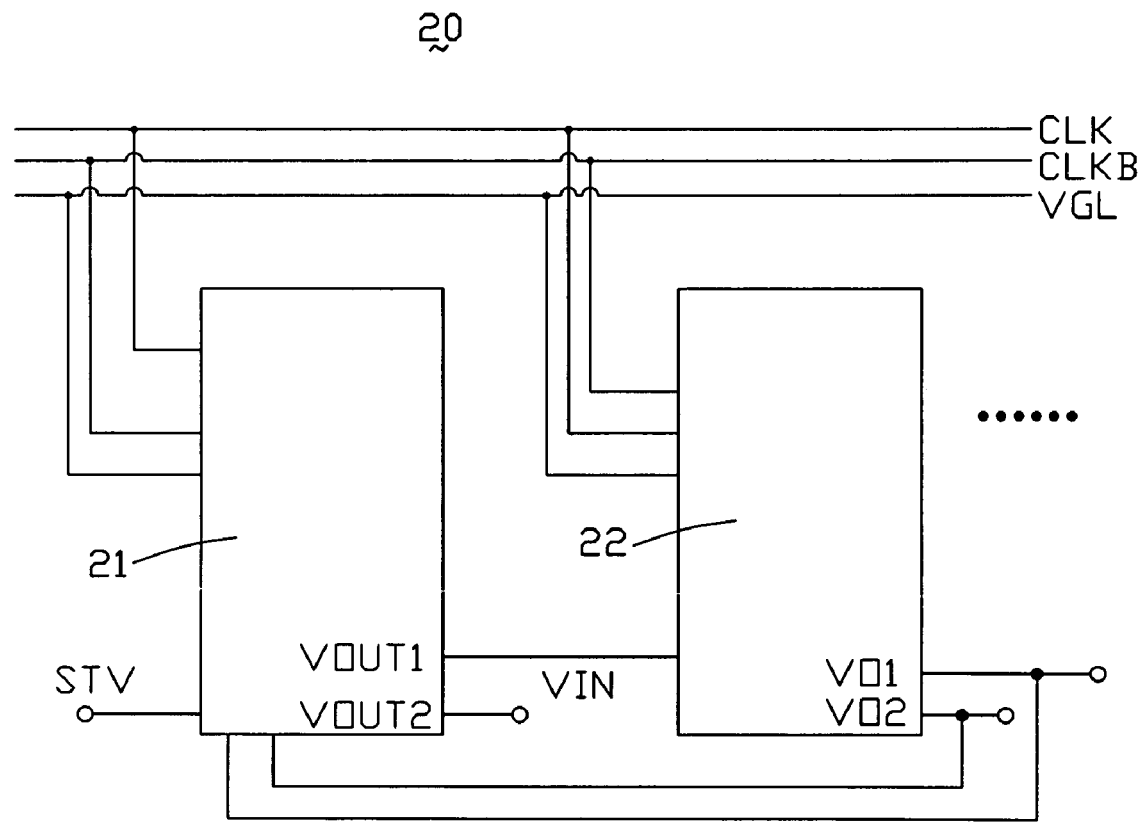
FIG. 1 illustrates a circuit diagram of one embodiment of a shift register of the present disclosure including a plurality of shift register units.

FIG. 1 illustrates a circuit diagram of one embodiment of a shift register 20 of the present disclosure including a plurality of shift register units 21, 22. The shift register units 21, 22 are connected in series, and each of which receives a first clock input CLK, a second clock input CLKB inverse to the first clock input CLK, and a low level input VGL. Each shift register unit 21 includes a plurality of NMOS (N-channel metal oxide semiconductor) transistors, and each NMOS transistor includes a gate, a source, and a drain. The shift register units 21 includes an input STV, a first output VOUT1, and a second VOUT2. Further, the shift register unit 22 includes an input VIN, a first output VO1, and a second output VO2. Signals output by the first output VOUT1 of the shift register unit 21 are transmitted to the input VIN of the shift register unit 22, and signals output by the first output VO1 and the second output VO2 of the shift register unit 22 may feedback to the shift register unit 21. The second output VOUT2 of the shift register unit 21 and the second output VO2 of the shift register unit 22 serve to output to an external circuit (not shown).

Figure 2:
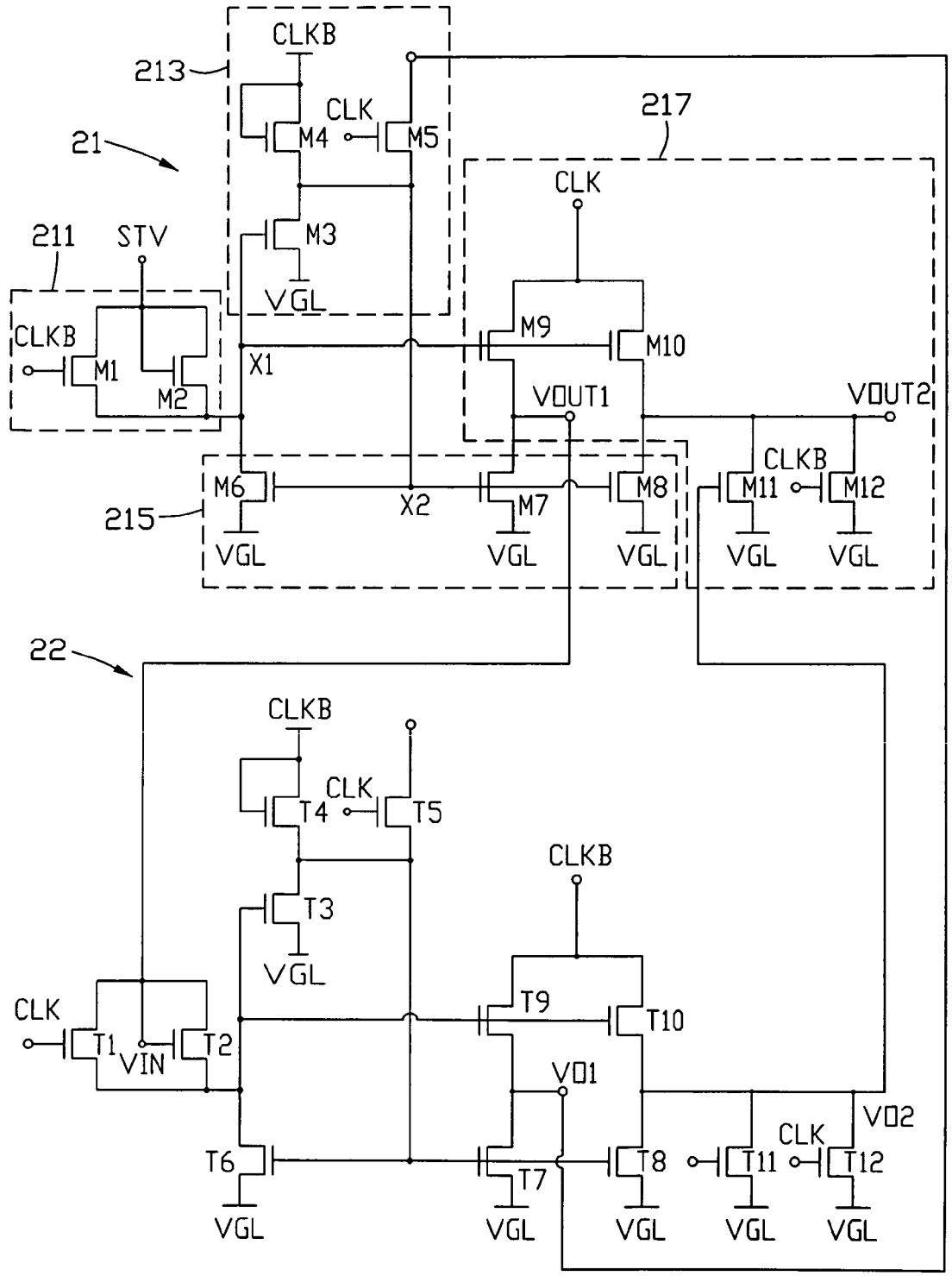
FIG. 2 illustrates a low-level schematic diagram of one embodiment of the shift register unit of FIG. 1.

FIG. 2 illustrates a low-level schematic diagram of one embodiment of the shift register units 21, 22. The shift register unit 21 includes an input circuit 211, a first logic circuit 213, a second logic circuit 215, an output circuit 217, a first node X1, and a second node X2. The input circuit 211, the first logic circuit 213, and the output circuit 217 are coupled to the first node X1. Further, the first logic circuit 213 and the second logic circuit 215 are coupled to the second node X2.

The input circuit 211 includes a first transistor M1 and a second transistor M2. A gate of the first transistor M1 is connected to the second clock input CLKB, and a drain of the first transistor M1 is connected to a drain of the second transistor M2. Further, sources of the first and second transistors M1, M2 are connected to the node X1. A gate of the second transistor M2 serves as an input STV of the first shift register unit 21, for receiving external input.

The first logic circuit 213 includes a third transistor M3, a fourth transistor M4, and a fifth transistor M5. A gate of the third transistor M3 is connected to the first node X1, and a source of the third transistor M3 receives the low level input VGL. Further, a drain of the third transistor M3 is connected to sources of the fourth and fifth transistors M4, M5. A gate and a drain of the fourth transistor M4 receive the second clock input CLKB. A gate of the fifth transistor M5 receives the first clock input CLK, and a drain of the fifth transistor M5 is connected to the first output VO1 of the second shift register unit 22.

The second logic input 215 includes a sixth transistor M6, a seventh transistor M7, and an eighth transistor M8. Gates of the sixth, the seventh, the eighth transistors M6, M7, M8 are connected to the second node X2. A source of the sixth transistor M6 receives the low level input VGL. Further, a drain of the sixth transistor M6 is connected to the first node X1. Sources of the seventh and eighth transistors M7, M8 receive the low level input VGL, and drains of the seventh and eighth transistors M7, M8 are connected to the output circuit 217.

The output circuit 217 includes a ninth transistor M9, a tenth transistor M10, an eleventh transistor M11, and a twelfth transistor M12. The ninth and tenth transistors M9, M10 serve as clock transistors of the output circuit 217. Gates of the ninth and tenth transistors M9, M10 are connected to the first node X1, and drains of the ninth and tenth transistors M9, M10 are connected to the first clock input CLK. Further, sources of the ninth and tenth transistors M9, M10 are respectively connected to the drains of the seventh and eighth transistors M7, M8, and serve as the first output VOUT1 and the second output VOUT2, respectively. Signals output by the first output VOUT1 are transmitted to the input VIN of the second shift register unit 22, and signals output by the second output VOUT2 are transmitted to an external circuit. The eleventh transistor M11 serves as a reset transistor, and a gate of which receives signals output by the second output VO2 of the second shift register unit 22. A source of the eleventh transistor M11 is connected to the low level input VGL, and a drain of the eleventh transistor M11 is connected to the second output VOUT2. The twelfth transistor M12 serves as a voltage stabilizing transistor, and a gate of the twelfth transistor M12 receives the second clock input CLKB. A source of the twelfth transistor M12 is connected to the low level input VGL, and a drain of the twelfth transistor M12 is connected to the second output VOUT2.

The second shift register unit 22 has an arrangement similar to that of the first shift register unit 21. The second shift register unit 22 has an input VIN for receiving signals output by the first output VOUT1 of the first shift register unit 21, and a first output VO1 connected to the drain of the fifth transistor M5 of the first shift register unit 21. Gates of a first and a twelfth transistors T1, T12 are connected to the first clock input CLK. Drains of a fourth transistor T4, a ninth transistor T9, and a tenth transistor T10 are connected to the second clock input CLKB.

Figure 3:
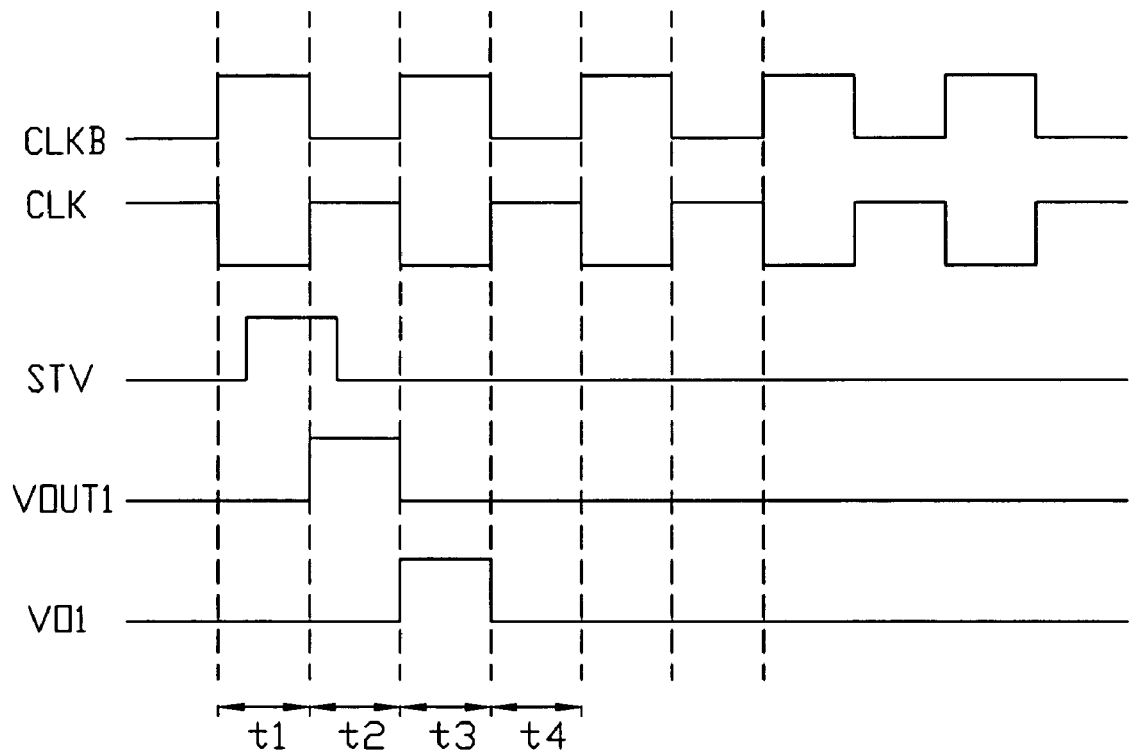
FIG. 3 illustrates a sequence waveform diagram of exemplary pulse signals of the shift register unit of FIG. 1.

FIG. 3 illustrates a sequence waveform diagram of exemplary pulse signals of the shift register units 21, 22 of FIG. 1. During a period t1, the first clock signal CLK is at a low level, and the second clock signal CLKB is at a high level. Further, the start signal STV turns from a low level to a high level during the period t1.

In the first shift register unit 21, the first transistor M1 of the input circuit 211 is switched on and the second transistor M2 is switched off while the input STV receives the low level voltage signal VGL. Then, the input circuit 211 outputs the low level signal VGL to the first node X1. Therefore, the ninth transistor M9, the tenth transistor M10, and the third transistor M3 are switched off. At the same time, the fourth transistor M4 of the first logic circuit 213 is switched on by the second clock signal CLKB, and outputs a high level signal VGH of the second clock signal CLKB to the second node X2. Then, the sixth, the seventh, the eighth transistors M6, M7, M8 of the second logic circuit 215 are switched on. The first output VOUT1 of the output circuit 217 outputs the low level signal VGL to the second shift register unit 22, and the second output VOUT2 of the output circuit 217 outputs the low level signal VGL to the external circuit (not shown). The twelfth transistor M12 of the output circuit 217 is switched on while receiving the second clock signal CLKB, so as to maintain the second output VOUT2 to output a low level signal VGL to the external circuit.

After that, when signals input to the input STV turns from a low level signal VGL to a high level signal VGH, the second transistor M2 is switched on, and the input circuit 211 outputs the high level signal VGH to the first node X1. Then, the ninth and tenth transistors M9 and M10 are switched on. The first output VOUT1, VOUT2 respectively outputs the first clock signal CLK. That is, the first output VOUT1 outputs the low level signal VGL to the second shift register unit 22, and the second output VOUT2 outputs the low level signal VGL to the external circuit. At the same time, the third transistor M3 of the first logic circuit 213 is switched on, so as to pull down the output signal of the fourth transistor M4. The first logic circuit 213 outputs a low level signal VGL to the second node X2. Then, the sixth, the seventh, and the eighth transistors M6, M7, M8 of the second logic circuit 215 are switched off. The first and second outputs VOUT1, VOUT2 respectively maintain to output the first clock signal CLK.

During the period t1, the second shift register unit 22 receives the first clock signal CLK at a low level VGL and the second clock signal CLKB at a high level VGH. The input VIN of the second shift register unit 22 receives the signals output by the first shift register unit 21, and the signals are maintained at a low level signal VGL. Then, the first, the second, the ninth, and the tenth transistors T1, T2, T9, T10 are all switched off. The first and second outputs VO1, VO2 respectively output the low level signal VGL. At the same time, the third transistor T3 is switched off, and the fourth transistor T4 is switched on via receiving the second clock signal CLKB. The second clock signal CLKB at high level VGH are transmitted to gates of the sixth, the seventh, and the eighth transistors T6, T7, T8, so as to make the low level signal VGL to be transmitted to the first and second outputs VO1, VO2 via the sixth, the seventh, and the eighth transistors T6, T7, T8. Therefore, the first and second outputs VO1, VO2 respectively maintain to output the low level signal VGL.

During a period t2, the first clock signal CLK is at a high level VGH, and the second clock signal CLKB is at a low level VGL. Further, the start signal STV turns from a high level VGH to a low level VGL during the period t2.

In the first shift register unit 21, the second transistor M2 of the input circuit 211 is switched on while the input STV receives the high level signal VGH. The input circuit 211 outputs the high level signal VGH to the first node X1. Then, the ninth and tenth transistors M9, M10 are switched on. Therefore, the first output VOUT1 of the output circuit 217 outputs the first clock signal CLK (the high level signal VGH) to the second shift register unit 22, and the second output VOUT2 of the output circuit 217 outputs the first clock signal CLK (the high level signal VGH) to the external circuit (not shown). At the same time, the third transistor M3 is switched on and the low level signal VGL is transmitted to the X2 via the third transistor M3. The sixth, the seventh, and the eighth transistors M6, M7, M8 are switched off.

After that, when signals input to the input STV of the first shift register unit 21 turns from a high level signal VGH to a low level signal VGH, the second transistor M2 is switched off. The first transistor M1 is switched off by the second clock signal CLKB. That is, the input circuit 211 does not output signals, and the first node X1 maintains at a high level. The output circuit 217 maintains output the first clock signal CKL.

During the period t2, the second shift register unit 22 receives the first clock signal CLK at a high level VGH and the second clock signal CLKB at a low level VGL. The input VIN of the second shift register unit 22 receives the signals output by the first shift register unit 21, and the signals are maintained at a high level VGH. Then, the first and second transistors T1, T2 are switched on to output the high level signal VGH to the ninth and tenth transistors T9, T10. The first and second outputs VO1, VO2 respectively output the second clock signal CLKB at a low level VGL. The twelfth transistor T12 is switched on to maintain the second output VO2 to output low level signal VGL to the external circuit. At the same time, the third transistor T3 is switched on, and the third transistor T3 outputs low level signal to shut off the sixth, the seventh, and the eighth transistors T6, T7, T8.

During the period t3, the first clock signal CLK is at a low level, and the second clock signal CLKB is at a high level. Further, the start signal STV maintains at a low level.

In the first shift register unit 21, the second transistor M2 is switched off, and the first transistor M1 is switched on and outputs a low level signal VGL. The first node X1 is at the low level signal VGL. The ninth and tenth transistors M9, M10 are switched off. At the same time, the third transistor M3 of the first logic circuit 213 is switched off, and the transistor M4 of the first logic circuit 213 receives and outputs the second clock signal CLKB. Then, the second node X2 is at the high level signal VGH. The sixth, the seventh, the eighth transistors M6, M7, M8 of the second logic circuit 215 are switched on, so as to pull down the voltage level of the first and second outputs VOUT1, VOUT2 of the output circuit 217. Such that, the first output VOUT1 of the output circuit 217 outputs the low level signal VGL to the second shift register unit 22, and the second output VOUT2 of the output circuit 217 outputs the low level signal VGL to the external circuit (not shown).

During the period t3, the second shift register unit 22 receives the first clock signal CLK at a low level VGL and the second clock signal CLKB at a high level VGH. The input VIN of the second shift register unit 22 receives the signals output by the first shift register unit 21, and the signals are maintained at a low level signal VGL. Then, the first and second transistors T1, T2 are switched off, and sources of which are maintained at a high level voltage. The ninth and tenth transistors T9, T10 are all switched on. The first and second outputs VO1, VO2 respectively output the second clock signal CLKB. At the same time, the third transistor T3 is switched on, which receives the low level signal to switch the sixth, the seventh, and the eighth transistors T6, T7, T8 off. Therefore, the first output VO1 outputs the high level signal VGH to a next shift register unit, and outputs a high level signal VGH to the drain of the fifth transistor M5 of the first shift register unit 21. Due to the fifth transistor M5 is switched on while receiving the second clock signal CLKB, the high level signal VGH output by the output VO1 may turn on the transistors of the second logic circuit 215, to reset the second logic circuit 215. The second output VO2 outputs the high level signal VGH to the external circuit, and output the high level signal VGH to the gate of the eleventh transistor M11 of the first shift register unit 21. The eleventh transistor M11 outputs the low level signal VGL, which cooperates with the eighth and twelfth transistors to maintain the second output VOUT2 of the first shift register unit 21 to output a low level signal VGL to the external circuit.

After the period t3, the input STV of the first shift register unit 21 receives the low level signal VGL, and the first and second clock signals CLK, CLKB are inverse to each other periodically vary. Due to the input STV maintains to receive the low level signal VGL, the signal output by the input circuit 211 is maintained at a low level. Then, the first node X1 is at a low level, and the ninth and tenth transistors M9, M10 are switched off. The first and second outputs VOUT1, VOUT2 maintain to output low level signal VGL. The twelfth transistors M12 to receive the second clock signal CLKB periodically switches on, so as to prevent the signals output by the second output VOUT2 from impacting by the periodically variation of the first clock signal CLK received by the ninth and tenth transistors M9, M10. Therefore, the second output VOUT2 may stably output the low level signal VGL to the external circuit.

After the period t3, the input VIN of the second shift register unit 22 receives the low level signal VGL output by the first shift register unit 22, and the first clock signal CLK and the second clock signal CLKB periodically vary. Due to the input VIN maintains to receive the low level signal VGL output by the first shift register unit 21, the second transistor T2 switches off and the first transistor T1 outputs low level signal VGL to make the ninth and tenth transistors M9, M10 to be switched off. Then, the second clock signal CLKB does not output via the first output VO1 and the second output VO2. The twelfth transistor M12 switches on due to receive the first clock signal CLK, so as to make the second output VO2 output the low level signal VGL. Meanwhile, the feedback signal from the next shift register unit is received and make the sixth, seventh, and eight transistors T6, T7, T8 to be switched on, so as to make the first output VO1 output the low level signal VGL. Therefore, after the period t3, the second shift register unit 22 maintains to output the low level signal VGL.

Compared with the conventional shift register unit 100, the first shift register unit 21 only needs to receive the first and second clock signals CLK, CLKB, and the low level signal VGL, while the input STV of the first shift register unit 21 outputs signal to the second shift register unit 22. Then, the layout of the shift register 20 only needs to arrange the circuit transmit the signals CLK, CLKB, VGL, so as to simplify the layout thereof. Moreover, the adjacent shift register units may not cause signal distortions between adjacent shift register units due to overlapping adjacent shift register signals. As a result, the shift register unit 21 is liable to be stable.

Figure 4:
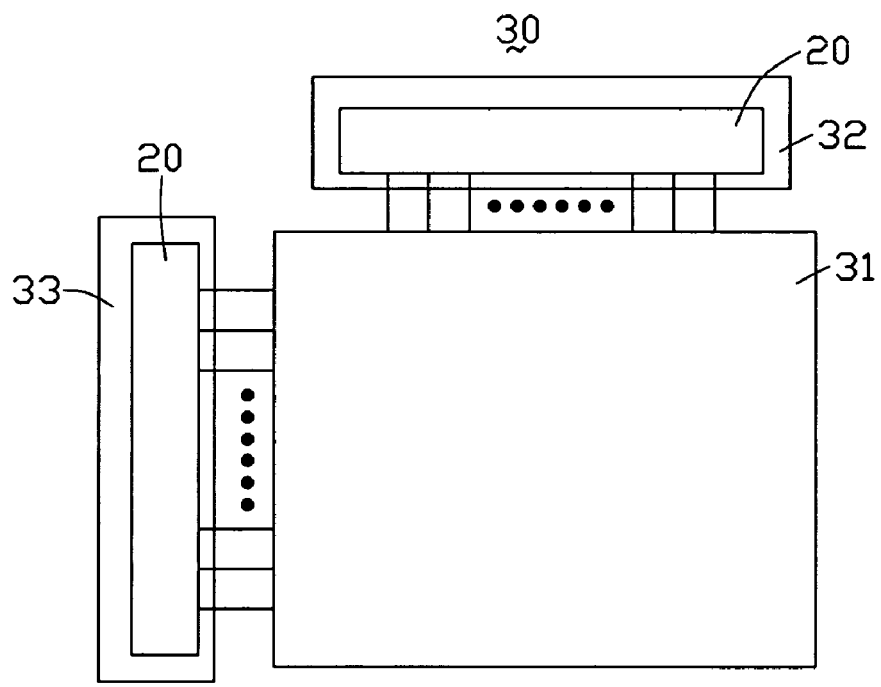
FIG. 4 illustrates one embodiment of a liquid crystal display employing at least one of the shift registers of FIG. 1.
Figure 5:
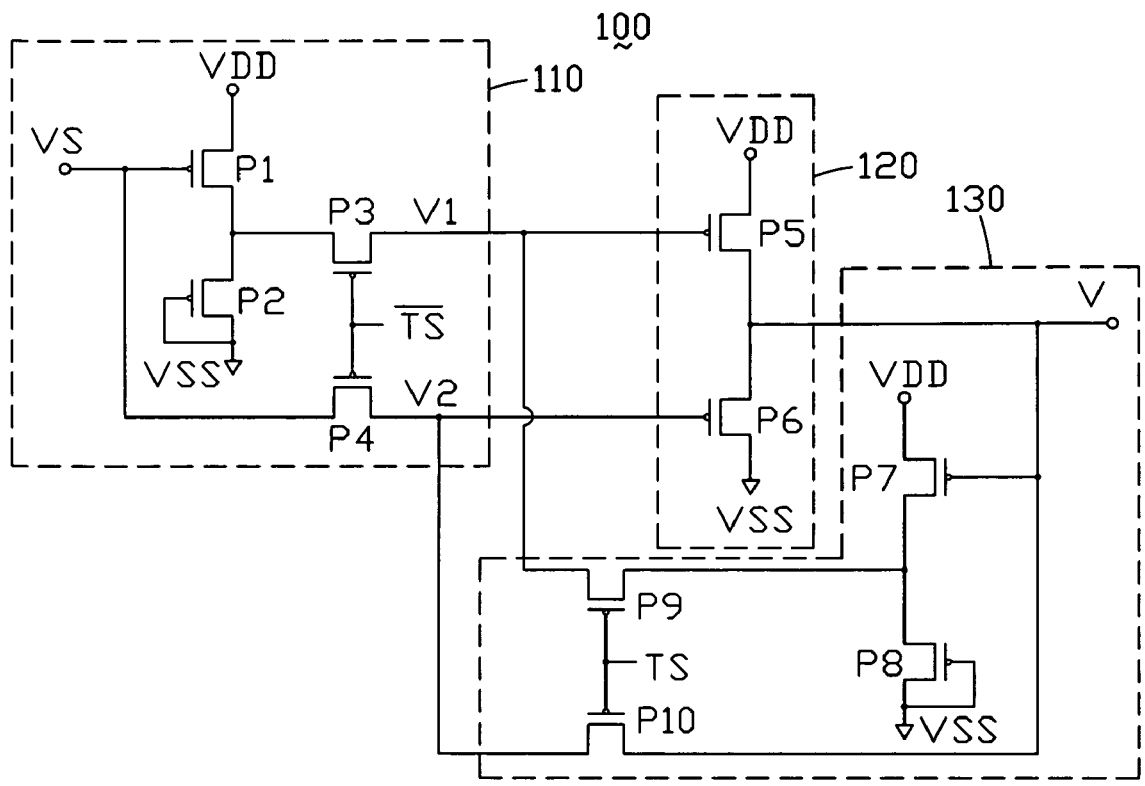
FIG. 5 is a circuit diagram of a shift register unit of a conventional shift register.
Figure 6:
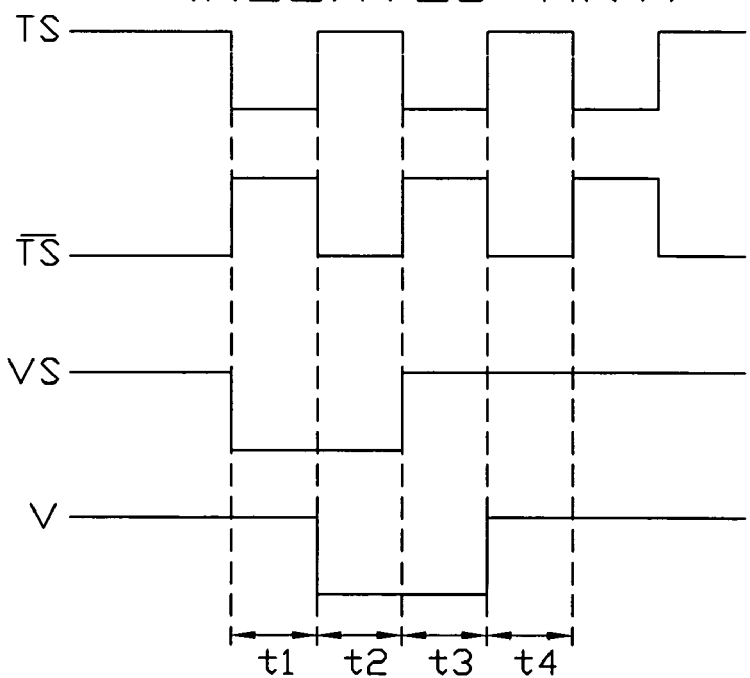
FIG. 6 is a sequence waveform diagram of pulse signals of the shift register of FIG. 5.

Referring to FIG. 4, a liquid crystal display employing the shift registers 20 is shown. The liquid crystal display 30 includes a liquid crystal display panel 31, a data driving circuit 32, and a gate driving circuit 33. Both the gate and data driving circuits 33, 32 install shift registers 20 to control output sequence of the gate driving signals and data signals, so as to control the images displayed by the liquid crystal display 30.

Accordingly, the liquid crystal display 30 employing the shift register 20 may not have a distorted display quality because adjacent scanning lines corresponding to adjacent columns or rows of TFTs may be scanned simultaneously by the shift register pulse signals instead of being scanned sequentially.

It is to be further understood that even though numerous characteristics and advantages of the present inventive embodiments have been set out in the foregoing description, together with details of the structures and functions of the embodiments, the disclosure is illustrative only, and that changes may be made in detail, especially in matters of shape, size, and arrangement of parts within the principles of the present disclosure to the full extent indicated by the broad general meaning of the terms in which the appended claims are expressed.

What is claimed is:

1. A shift register, comprising:
a plurality of shift register units being controlled by a low level voltage signal, and two clock signals being inversed of each other;
wherein the two clock signals are a first clock signal and a second clock signal, each of the shift register units comprises a plurality of N-channel metal oxide semiconductor transistors to form an output circuit, an input circuit, a first logic circuit, and a second logic circuit, the input circuit, the first logic circuit, and the output circuit are coupled to a first node, and the first logic circuit and the second logic circuit are coupled to a second node;
wherein the input circuit controls the first logic circuit to output the low level voltage signal or the clock signals, and controls the output circuit to output clock signals; and the second logic circuit controls the output circuit to output the low level voltage signal;
wherein the first logic circuit comprise a first transistor, a second transistor, and a third transistor, a gate of the first transistor is connected to the first node, and a source of the first transistor receives the low level voltage signal, a drain of the first transistor is connected to a source of the second transistor, a gate and a drain of the second transistor receive the second clock signal, a gate of the third transistor receives the first clock signal, a source of the third transistor is connected to the second node, and a drain of the third transistor is connected to a next adjacent shift register unit.

2. The shift register of claim 1, wherein the input circuit comprises a fourth transistor and a fifth transistor, a gate of the fourth transistor is connected to an external circuit and receives the second clock signal, a drain of the fourth transistor is connected to a drain of the fifth transistor, and sources of the fourth and fifth transistors are connected to the first node.

3. The shift register of claim 1, wherein the second logic circuit comprises a sixth transistor, a seventh transistor, and an eighth transistor, gates of the sixth, the seventh, the eighth transistors are connected to the second node, a source of the sixth transistor receives the low level voltage signal, a drain of the sixth transistor is connected to the first node, sources of the seventh and eighth transistors receive the low voltage signal, and drains of the seventh and eighth transistors are connected to the output circuit.

4. The shift register of claim 3, wherein the output circuit includes a ninth transistor and a tenth transistor, gates of the ninth and tenth transistors are connected to the first node, drains of the ninth and tenth transistors receive the first clock signal, and sources of the ninth and tenth transistors are respectively connected to the drains of the seventh and eighth transistors, so as to respectively output signal to a next adjacent shift register unit and an external circuit.

5. The shift register of claim 4, wherein the output circuit further comprises an eleventh reset transistor serving as a reset transistor and a twelfth transistor serving as a voltage stabilizing transistor, a gate of the eleventh transistor receives signals output by the next adjacent shift register unit, a source of the eleventh transistor receives the low level voltage signal, and a drain of the eleventh transistor is connected to a source of the tenth transistor; a gate of the twelfth transistor receives the second clock signal, a source of the twelfth transistor receives the low level voltage signal, and a drain of the twelfth transistor is connected to the source of the tenth transistor.

6. A liquid crystal display, comprising:
a liquid crystal panel;
a gate driving circuit; and
a data driving circuit;
wherein each of the gate driving circuit and the data driving circuit comprises at least one shift register, wherein each of the shift registers comprises a plurality of shift register units connected in stages, each of the shift register units is controlled by a low level voltage signal, and two clock signals being inversed of each other;
wherein the two clock signals are a first clock signal and a second clock signal, each of the shift register units comprises a plurality of N-channel metal oxide semiconductor transistors to form an output circuit, an input circuit, a first logic circuit, and a second logic circuit, the input circuit, the first logic circuit, and the output circuit are coupled to a first node, and the first logic circuit and the second logic circuit are coupled to a second node;
wherein the input circuit controls the first logic circuit to output the low level voltage signal or the clock signals, and controls the output circuit to output clock signals; and the second logic circuit controls the output circuit to output the low level voltage signal;
wherein the first logic circuit comprise a first transistor, a second transistor, and a third transistor, a gate of the first transistor is connected to the first node, and a source of the first transistor receives the low level voltage signal, a drain of the first transistor is connected to a source of the second transistor, a gate and a drain of the second transistor receive the second clock signal, a gate of the third transistor receives the first clock signal, a source of the third transistor is connected to the second node, and a drain of the third transistor is connected to a next adjacent shift register unit.

7. The liquid crystal display of claim 6, wherein the input circuit comprises a fourth transistor and a fifth transistor, a gate of the fourth transistor is connected to an external circuit and receives the second clock signal, a drain of the fourth transistor is connected to a drain of the fifth transistor, sources of the fourth and fifth transistors are connected to the first node.

8. The liquid crystal display of claim 7, wherein the second logic circuit comprises a sixth transistor, a seventh transistor, and an eighth transistor, gates of the sixth, the seventh, the eighth transistors are connected to the second node, a source of the sixth transistor receives the low level voltage signal, a drain of the sixth transistor is connected to the first node, sources of the seventh and eighth transistors receive the low level voltage signal, and drains of the seventh and eighth transistors are connected to the output circuit.

9. The liquid crystal display of claim 8, wherein the output circuit includes a ninth transistor and a tenth transistor, gates of the ninth and tenth transistors are connected to the first node, drains of the ninth and tenth transistors receive the first clock signal, and sources of the ninth and tenth transistors are respectively connected to the drains of the seventh and eighth transistors, so as to respectively output signal to a next adjacent shift register unit and an external circuit.

10. The liquid crystal display of claim 9, wherein the output circuit further comprises an eleventh reset transistor serving as a reset transistor and a twelfth transistor serving as a voltage stabilizing transistor, a gate of the eleventh transistor receives signals output by the next adjacent shift register unit, a source of the eleventh transistor receives the low level voltage signal, and a drain of the eleventh transistor is connected to a source of the tenth transistor; a gate of the twelfth transistor receives the second clock signal, a source of the twelfth transistor receives the low level voltage signal, and a drain of the twelfth transistor is connected to the source of the tenth transistor.

11. A shift register, comprising:
a plurality of shift register units connected in stages being controlled by a low level voltage signal and two clock signals being inversed of each other;
wherein each of the shift register units comprises an input, a first output, and a second output, signals output by the first output are provided to an input of a next adjacent shift register unit, signals output by first and second outputs of the next adjacent shift register unit are provided in feedback to a previous adjacent shift register unit, and the signals output by the second output of each of the shift register units are provided to an external circuit;
wherein each of the shift register units further comprises an output circuit, an input circuit, a first logic circuit, and a second logic circuit, the input circuit controls the first logic circuit to output the low level voltage signal or the clock signals and controls the output circuit to output clock signals, and the second logic circuit controls the output circuit to output the low level voltage signal.

12. The shift register of claim 11, wherein the input circuit comprises a first transistor and a second transistor, a gate of the first transistor is connected to an external circuit and receives the second clock signal, a drain of the first transistor is connected to a drain of the second transistor, and sources of the first and second transistors are connected to the first node.

13. The shift register of claim 12, wherein the first logic circuit comprise a third transistor, a fourth transistor, and a fifth transistor, a gate of the third transistor is connected to the first node, and a source of the third transistor receives the low level voltage signal, a drain of the third transistor is connected to a source of the fourth transistor, a gate and a drain of the fourth transistor receive the second clock signal, a gate of the fifth transistor receives the first clock signal, a source of the fifth transistor is connected to the second node, and a drain of the fifth transistor is connected to the next adjacent shift register unit.

14. The shift register of claim 13, wherein the second logic circuit comprises a sixth transistor, a seventh transistor, and an eighth transistor, gates of the sixth, the seventh, the eighth transistors are connected to the second node, a source of the sixth transistor receives the low level voltage signal, a drain of the sixth transistor is connected to the first node, sources of the seventh and eighth transistors receive the low level voltage signal, and drains of the seventh and eighth transistors are connected to the output circuit.

15. The shift register of claim 14, wherein the output circuit includes a ninth transistor and a tenth transistor, gates of the ninth and tenth transistors are connected to the first node, drains of the ninth and tenth transistors receive the first clock signal, and sources of the ninth and tenth transistors are respectively connected to the drains of the seventh and eighth transistors, so as to respectively output signal to the next adjacent shift register unit and the external circuit.

16. The shift register of claim 15, wherein the output circuit further comprises an eleventh reset transistor serving as a reset transistor and a twelfth transistor serving as a voltage stabilizing transistor, a gate of the eleventh transistor receives signals output by the next adjacent shift register unit, a source of the eleventh transistor receives the low level voltage signal, and a drain of the eleventh transistor is connected to a source of the tenth transistor; a gate of the twelfth transistor receives the second clock signal, a source of the twelfth transistor receives the low level voltage signal, and a drain of the twelfth transistor is connected to the source of the tenth transistor.

17. The shift register of claim 16, wherein the first, second, third, fourth, fifth, sixth, seventh, eighth, ninth, tenth, eleventh and twelfth transistors are N-channel metal oxide semiconductor transistors.

* * * * *